United States Patent
Chen et al.

(10) Patent No.: US 10,475,718 B2
(45) Date of Patent: Nov. 12, 2019

(54) SEMICONDUCTOR DEVICE PACKAGE COMPRISING A DIELECTRIC LAYER WITH BUILT-IN INDUCTOR

(71) Applicant: Advanced Semiconductor Engineering, Inc., Kaohsiung (TW)

(72) Inventors: Chien-Hua Chen, Kaohsiung (TW); Hung-Yi Lin, Kaohsiung (TW); Cheng-Yuan Kung, Kaohsiung (TW); Teck-Chong Lee, Kaohsiung (TW); Shiuan-Yu Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 75 days.

(21) Appl. No.: 15/599,379

(22) Filed: May 18, 2017

(65) Prior Publication Data

US 2018/0337164 A1 Nov. 22, 2018

(51) Int. Cl.
*H01L 23/522* (2006.01)
*H01L 23/31* (2006.01)
(Continued)

(52) U.S. Cl.
CPC ...... *H01L 23/3121* (2013.01); *H01L 21/6835* (2013.01); *H01L 23/3128* (2013.01);
(Continued)

(58) Field of Classification Search
CPC .............. H01L 25/165; H01L 21/6835; H01L 23/3128; H01L 23/3121; H01L 24/49; H01L 23/5329; H01L 24/06; H01L 23/5227; H01L 2924/19107; H01L 2924/181; H01L 2924/19105; H01L 2924/15311; H01L 2924/00014;
(Continued)

(56) References Cited

U.S. PATENT DOCUMENTS

| | | | |
|---|---|---|---|
| 2014/0312458 A1* | 10/2014 | Ashrafzadeh | H01L 23/3121 257/531 |
| 2015/0042438 A1* | 2/2015 | Liu | H01F 27/2804 336/200 |

(Continued)

*Primary Examiner* — William F Kraig
*Assistant Examiner* — Pavel G Ivanov
(74) *Attorney, Agent, or Firm* — Foley & Lardner LLP; Cliff Z. Liu

(57) ABSTRACT

A semiconductor device package includes a dielectric layer, a first RDL, a second RDL, an inductor, a first electronic component and a second electronic component. The first RDL is adjacent to a first surface of the dielectric layer, and the first RDL includes first conductive pieces. The second RDL is adjacent to a second surface of the dielectric layer, and the second RDL includes second conductive pieces. The inductor is disposed in the dielectric layer. The inductor includes induction pillars, wherein each of the induction pillars is disposed through the dielectric layer, and each of the induction pillars is interconnected between a respective one of the first conductive pieces of the first RDL and a respective one of the second conductive pieces of the second RDL. The first electronic component and the second electronic component are between the first RDL and the second RDL, and electrically connected to each other through the inductor.

18 Claims, 24 Drawing Sheets

(51) Int. Cl.
    *H01L 23/00*    (2006.01)
    *H01L 23/532*   (2006.01)
    *H01L 21/683*   (2006.01)
    *H01L 23/498*   (2006.01)
    *H01L 25/065*   (2006.01)
    *H01L 25/16*    (2006.01)

(52) U.S. Cl.
    CPC .... *H01L 23/49827* (2013.01); *H01L 23/5227* (2013.01); *H01L 23/5329* (2013.01); *H01L 24/06* (2013.01); *H01L 24/19* (2013.01); *H01L 24/49* (2013.01); *H01L 25/0655* (2013.01); *H01L 25/16* (2013.01); *H01L 24/13* (2013.01); *H01L 24/16* (2013.01); *H01L 2221/68345* (2013.01); *H01L 2221/68368* (2013.01); *H01L 2224/02331* (2013.01); *H01L 2224/04105* (2013.01); *H01L 2224/12105* (2013.01); *H01L 2224/13101* (2013.01); *H01L 2224/16225* (2013.01); *H01L 2224/18* (2013.01); *H01L 2224/32225* (2013.01); *H01L 2224/48091* (2013.01); *H01L 2224/73267* (2013.01); *H01L 2224/81005* (2013.01); *H01L 2924/00014* (2013.01); *H01L 2924/15311* (2013.01); *H01L 2924/181* (2013.01); *H01L 2924/18162* (2013.01); *H01L 2924/19105* (2013.01); *H01L 2924/19107* (2013.01)

(58) Field of Classification Search
    CPC ....... H01L 2224/18; H01L 2224/16225; H01L 2221/68368; H01L 2221/68345; H01L 2224/48091; H01L 2224/02331; H01L 24/19; H01L 25/16; H01L 25/0655; H01L 23/49827
    See application file for complete search history.

(56)         References Cited

U.S. PATENT DOCUMENTS

| | | | |
|---|---|---|---|
| 2015/0079354 A1* | 3/2015 | Sakamoto | G02B 1/118 428/172 |
| 2015/0303174 A1 | 10/2015 | Yu et al. | |
| 2016/0276232 A1 | 9/2016 | Lin et al. | |
| 2016/0343694 A1 | 11/2016 | Lin et al. | |
| 2018/0138126 A1* | 5/2018 | Chen | H01L 23/5386 |

* cited by examiner

SEMICONDUCTOR DEVICE PACKAGE COMPRISING A DIELECTRIC LAYER WITH BUILT-IN INDUCTOR

BACKGROUND

1. Technical Field

The present disclosure relates to a semiconductor device package, and more particularly to a semiconductor device package with reduced physical size and thickness.

2. Description of the Related Art

The semiconductor industry has experienced rapid growth due to continuous improvements in the integration density of a variety of electronic components. As the demand for miniaturization, higher speed and lower power consumption has grown continuously, a stacked device package such as a three-dimensional (3D) device package has been developed as a way to further reduce the physical size of the device package. In a stacked device package, active components such as logic circuits, memories, processor circuits and the like, and passive components such as capacitors, inductors, resistors and the like are fabricated on separate semiconductor wafers. The active and passive components are installed on top of one another to further reduce the lateral form factor of the device package. The stacked structure may reduce the area of the package device, but the overall thickness and size of the package device may be otherwise increased.

SUMMARY

In some embodiments, a semiconductor device package includes a dielectric layer, a first redistribution layer (RDL), a second RDL, an inductor, a first electronic component and a second electronic component. The dielectric layer includes a first surface, and a second surface opposite to the first surface. The first RDL is adjacent to the first surface of the dielectric layer, and the first RDL includes a plurality of first conductive pieces. The second RDL is adjacent to the second surface of the dielectric layer, and the second RDL includes a plurality of second conductive pieces. The inductor is disposed in the dielectric layer. The inductor includes a plurality of induction pillars, wherein each of the induction pillars is disposed through the dielectric layer, and each of the induction pillars is interconnected between a respective one of the first conductive pieces of the first RDL and a respective one of the second conductive pieces of the second RDL. The first electronic component and the second electronic component are between the first RDL and the second RDL, and electrically connected to each other through the inductor.

In some embodiments, a semiconductor device package includes a dielectric layer, a first electronic component, a second electronic component and an inductor. The dielectric layer includes a first surface, and a second surface opposite to the first surface. The first electronic component and the second electronic component are disposed in the dielectric layer. The inductor is disposed in the dielectric layer, and electrically connected to the first electronic component and the second electronic component. The inductor includes at least one core area substantially perpendicular to the first surface or the second surface of the dielectric layer.

In some embodiments, a semiconductor device package includes a dielectric layer, an inductor, a plurality of conductive pieces and a wire. The dielectric layer includes a first surface, and a second surface opposite to the first surface. The inductor is in the dielectric layer, and the inductor includes a plurality of induction pillars through the dielectric layer. The conductive pieces are disposed over the first surface and the second surface of the dielectric layer, and electrically connected to a portion of the induction pillars. The wire is electrically connected to at least one of the induction pillars, and is configured to adjust an impedance of the inductor.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
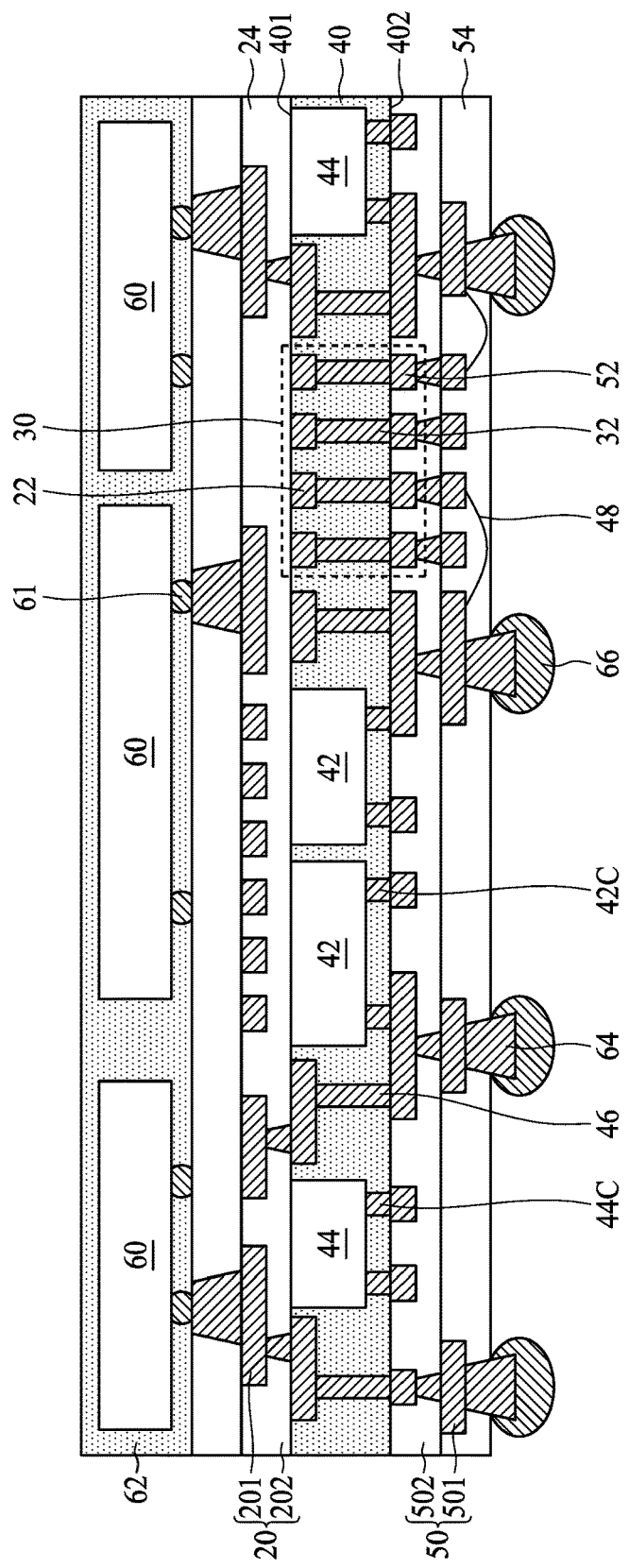
FIG. 1 illustrates a cross-sectional view of a semiconductor device package in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

At least some embodiments of the present disclosure are directed to a semiconductor device package. In some embodiments, the semiconductor device package includes a dielectric layer interposed between two redistribution layers (RDLs), an inductor, and two or more electronic components. The inductor includes induction pillars penetrating through the dielectric layer. The two or more electronic components are disposed in the dielectric layer and are electrically connected to each other through the inductor. In some embodiments, the inductor includes at least one core area substantially perpendicular to a surface such as a top surface or a bottom surface of the dielectric layer. In some embodiments, the semiconductor device package includes conductive pieces over the top surface and the bottom surface of the dielectric layer, and electrically connected to a portion of the induction pillars. In some embodiments, the semiconductor device package includes one or more wires connected to a portion of the induction pillars to adjust an impedance of the inductor.

In some embodiments, the semiconductor device package includes a dielectric layer interposed between two RDLs. The semiconductor device package further includes an integrated inductor including induction pillars penetrating through the dielectric layer and conductive pieces over two opposite surfaces of the dielectric layer and electrically connected to the induction pillars. The semiconductor device package further includes two or more electronic components electrically connected to each other through the integrated inductor. The induction pillars of the integrated inductor are disposed between the RDLs and adjacent to the electronic components. Thus, the thickness and the size of the semiconductor device package may be reduced. In some embodiments, the semiconductor device package may include one or more wires electrically connected to the induction pillars. The wires may be formed subsequent to formation of the inductor, and thus may be configured to adjust the impedance of the inductor.

FIG. 1 is a cross-sectional view of a semiconductor device package 1 in accordance with some embodiments of the present disclosure. As shown in FIG. 1, the semiconductor device package 1 includes a dielectric layer 40, an inductor 30, one or more first electronic components 42 and one or more second electronic components 44. The dielectric layer 40 includes a first surface 401 (e.g., a top surface), and a second surface 402 (e.g., a bottom surface) opposite to the first surface 401. In some embodiments, the dielectric layer 40 includes a polymeric dielectric layer such as a molding compound layer. By way of example, the material of the polymeric dielectric layer may include, but is not limited to, polyimide (PI), polybenzoxazole (PBO) or other suitable materials. In some embodiments, the material of the polymeric dielectric layer may include or may be formed from, but is not limited to, a photo-curable material such as a photoresist or the like.

In some embodiments, the semiconductor device package 1 may further include a first redistribution layer (RDL) 20 and a second RDL 50. The first RDL 20 is disposed adjacent to the first surface 401 of the dielectric layer 40, and the second RDL 50 is disposed adjacent to the second surface 402 of the dielectric layer 40. In some embodiments, the first RDL 20 includes one or more conductive layers 201 and one or more insulating layers 202 stacked to one another. One of the conductive layers 201 may include first conductive pieces 22 exposed from at least one insulating layer 202 and adjacent to the first surface 401 of the dielectric layer 40. In some embodiments, edges of the first conductive pieces 22 are surrounded by the dielectric layer 40, while one or more surfaces such as upper surfaces of the first conductive pieces 22 are exposed from the first surface 401 of the dielectric layer 40. In some embodiments, the insulating layer 202 may include a silicon oxide layer, a silicon nitride layer or the like.

In some embodiments, a hardness of the insulating layer 202 is greater than a hardness of the dielectric layer 40. For example, the hardness of the insulating layer 202, measured as an indentation hardness, may be at least about 1.1 times, at least about 1.3 times, or at least about 1.5 times the hardness of the dielectric layer 40. In some embodiments, the second RDL 50 includes one or more conductive layers 501 and one or more insulating layers 502 stacked to one another, and one of the conductive layers 501 may include second conductive pieces 52 exposed from the insulating layer 502 and adjacent to the second surface 402 of the dielectric layer 40. In some embodiments, the second conductive pieces 52 are over the second surface 402 of the dielectric layer 40.

The inductor 30 is disposed in the dielectric layer 40. In some embodiments, the inductor 30 includes one or more induction pillars 32. Each of the induction pillars 32 penetrates through the dielectric layer 40, and is interconnected between a respective one of the first conductive pieces 22 of the first RDL 20 and a respective one of the second conductive pieces 52 of the second RDL 50. In some embodiments, a sum of the heights of an induction pillar 32 and a first conductive piece 22 is substantially equal to the thickness of the dielectric layer 40. In some embodiments, at least some of the induction pillars 32 are electrically connected to at least one of the conductive layers 201 and/or at least one of the conductive layers 501 through the first conductive pieces 22 and/or the second conductive pieces 52. In some embodiments, the inductor 30 includes at least one core area substantially perpendicular to the first surface 401 or the second surface 402 of the dielectric layer 40, where the core area includes one or more of the induction pillars 32.

The first electronic component 42 and the second electronic component 44 are disposed in the dielectric layer 40. In some embodiments, the first electronic component 42 and the second electronic component 44 each may include at least one semiconductor die in the form of an integrated circuit (IC). In some embodiments, the first electronic component 42 may include, but is not limited to, at least one active component such as a processor component, a switch component, an application specific IC (ASIC), a field-programmable gate array (FPGA), a digital signal processor (DSP), a memory component or another active component. In some embodiments, the second electronic component 44 may include, but is not limited to, at least one passive component such as a capacitor, a resistor or the like.

In some embodiments, the first electronic component 42 and/or the second electronic component 44 may be one or more flip chip components mounted on and electrically connected to the second RDL 50 by surface-mount technology (SMT). In some embodiments, the first electronic component 42 and the second electronic component 44 may be electrically connected to each other through, e.g., the inductor 30. In some embodiments, the first electronic component 42 and the second electronic component 44 may be electrically connected to the second RDL 50 through conductive structures 42C and conductive structures 44C, respectively. The conductive structures 42C and the conductive structures 44C may include, e.g., conductive pillars, conductive posts, bonding pads or the like.

In some embodiments, the semiconductor device package 1 further includes connection pillars 46 that penetrate through the dielectric layer 40 and are electrically connected to the first RDL 20 and the second RDL 50. In some embodiments, the first electronic component 42 and the second electronic component 44 may be further electrically connected to the first RDL 20 through, e.g., the inductor 30 and to at least a portion of the second RDL 50 through, e.g., the connection pillars 46. In some embodiments, the conductive structures 42C and the conductive structures 44C may be shorter than the induction pillars 32 and the connection pillars 46. In some embodiments, at least one end of each of the conductive structures 42C, the conductive structures 44C, the induction pillars 32 and the connection pillars 46 may be substantially at the same level as and electrically connected to the second RDL 50.

In some embodiments, the semiconductor device package 1 may further include one or more third electronic components 60 disposed over the first RDL 20. At least one third electronic component 60 may be disposed opposite to the first electronic component 42 and the second electronic component 44. In some embodiments, at least one third electronic component 60 may be electrically connected to the first RDL 20 through one or more conductive bumps 61 such as solder bumps, solder balls, solder pastes or the like. In some embodiments, at least one third electronic component 60 may be electrically connected to the first electronic component 42 and/or the second electronic component 44 through the first RDL 20. In some embodiments, the third electronic components 60 may include, but are not limited to, at least one active component such as a processor component, a switch component, an ASIC, a FPGA, a DSP, a memory component or another active component. In some embodiments, the semiconductor device package 1 may further include an encapsulant 62 disposed over the first RDL 20 and encapsulating the third electronic component 60.

In some embodiments, the semiconductor device package 1 may further include at least one wire 48 disposed over the second RDL 50. The wire 48 may be electrically connected to one of the second conductive pieces 52 at one end of the wire 48, and electrically connected to another one of the second conductive pieces 52 at another end of the wire 48. In some embodiments, the wire 48 may be formed by, e.g., wire bonding. The wire 48 may be formed subsequent to formation of the inductor 30, and thus may be configured to adjust the impedance of the inductor 30 if an actual impedance of the inductor 30 is deviated from a pre-designed impedance.

In some embodiments, the semiconductor device package 1 may further include a molding layer 54 over the second RDL 50 and encapsulating the wire 48. In some embodiments, one or more conductive structures 64 such as under-bump metallizations (UBMs) may be disposed over the molding layer 54, and electrically connected to the second RDL 50. In some embodiments, conductive bumps 66 such as solder bumps, solder balls, solder pastes or the like, may be mounted over and electrically connected to the conductive structures 64, and configured to electrically connect to another electronic device such as a circuit board or the like.

Figure 2A:
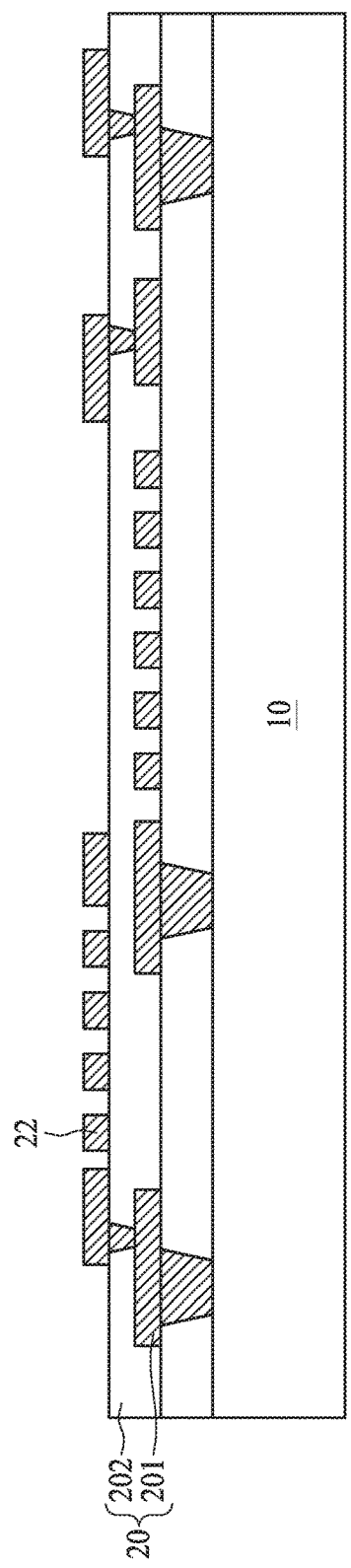
FIG. 2A illustrates one or more stages of an example of a manufacturing method of a semiconductor device package in accordance with some embodiments of the present disclosure.

FIG. 2A, FIG. 2B, FIG. 2C, FIG. 2D and FIG. 2E illustrate various stages of an example of a manufacturing method of the semiconductor device package 1 in accordance with some embodiments of the present disclosure. As depicted in FIG. 2A, the first RDL 20 including the first conductive pieces 22 is formed over a carrier substrate 10. In some embodiments, the carrier substrate 10 may include, but is not limited to, a glass substrate.

Figure 2B:
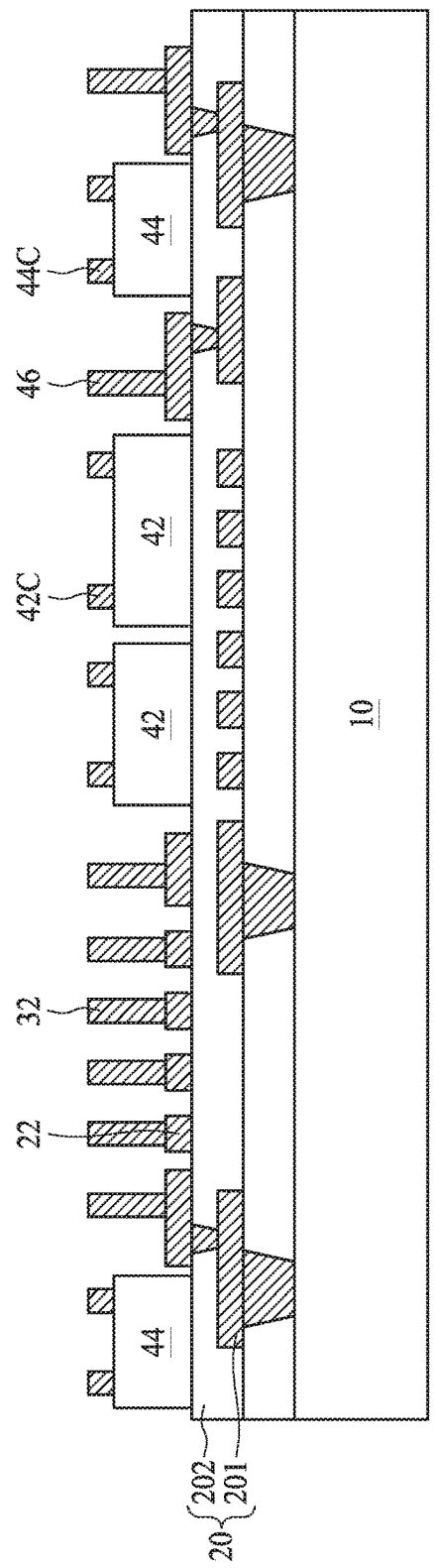
FIG. 2B illustrates one or more stages of an example of a manufacturing method of a semiconductor device package in accordance with some embodiments of the present disclosure.

As depicted in FIG. 2B, the induction pillars 32 are formed over the first RDL 20, and electrically connected to the first conductive pieces 22. In some embodiments, the connection pillars 46 are formed over the first RDL 20, and electrically connected to the first RDL 20. In some embodiments, the induction pillars 32 and the connection pillars 46 are formed simultaneously in the same process. In some other embodiments, the induction pillars 32 are formed before or after the connection pillars 46 being formed. In some embodiments, one or more first electronic components 42 and one or more second electronic components 44 are mounted on and electrically connected to the first RDL 20.

Figure 2C:
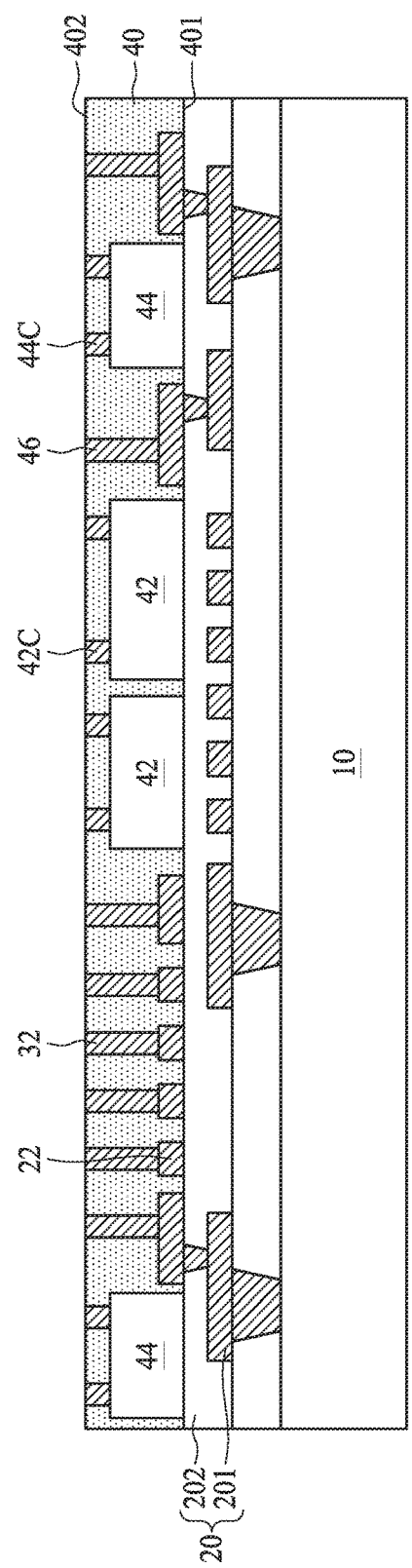
FIG. 2C illustrates one or more stages of an example of a manufacturing method of a semiconductor device package in accordance with some embodiments of the present disclosure.

As depicted in FIG. 2C, the dielectric layer 40 is formed over the first RDL 20. In some embodiments, at least some portion(s) of the first conductive pieces 22, the induction pillars 32, the connection pillars 46, the first electronic components 42 and the second electronic components 44 are encapsulated by the dielectric layer 40. In some embodiments, at least some portion(s) of the induction pillars 32, the connection pillars 46, the first electronic components 42 and the second electronic components 44 are exposed from the second surface 402 of the dielectric layer 40.

Figure 2D:
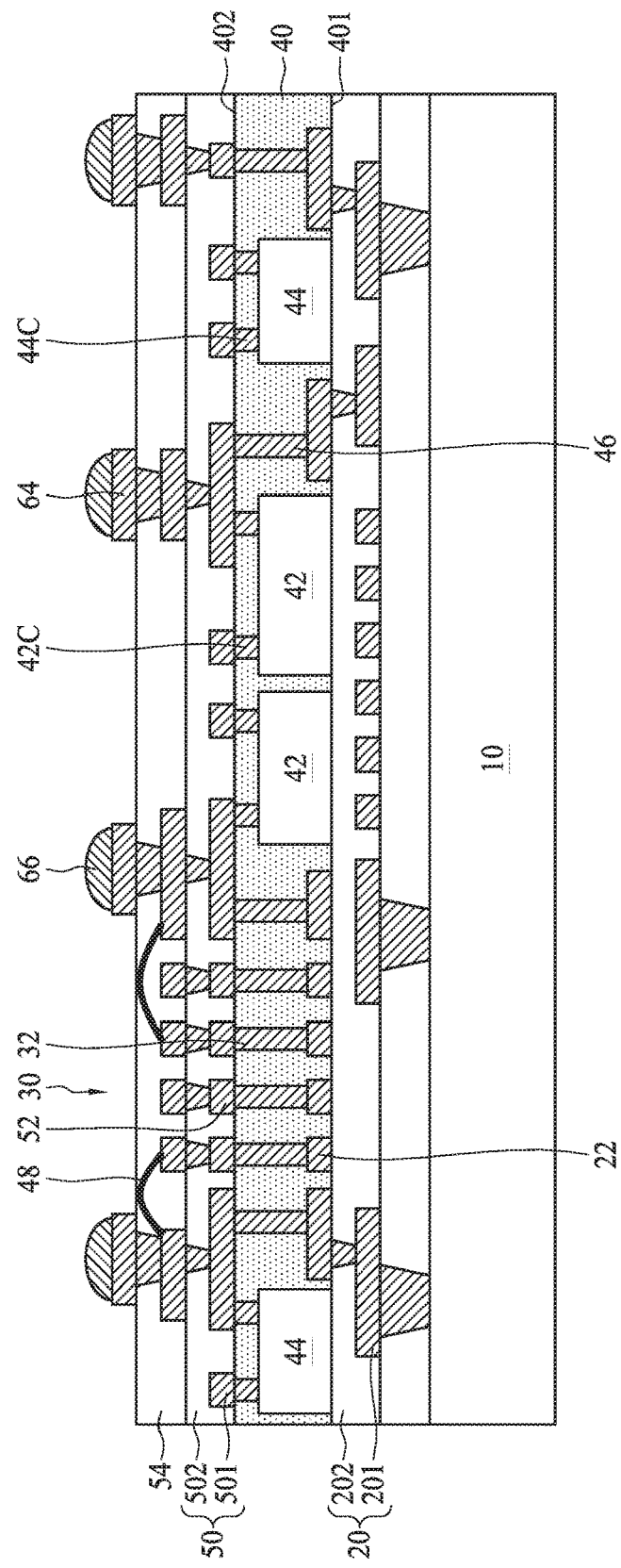
FIG. 2D illustrates one or more stages of an example of a manufacturing method of a semiconductor device package in accordance with some embodiments of the present disclosure.

As depicted in FIG. 2D, the second RDL 50 including the second conductive pieces 52 is formed over the second surface 402 of the dielectric layer 40. The second conductive pieces 52 are electrically connected to at least a portion of the induction pillars 32. The second RDL 50 is electrically connected to the connection pillars 46. The second conductive pieces 52, the induction pillars 32 and the first conductive pieces 22 are electrically connected and collectively form the inductor 30. In some embodiments, at least one wire 48 may be formed to electrically connect one of the second conductive pieces 52 at one end of the wire 48, and to electrically connect another one of the second conductive pieces 52 at another end of the wire 48. In some embodiments, the wire 48 may be formed by wire bonding, but not limited thereto. In some embodiments, the molding layer 54 may be formed over the second RDL 50 to encapsulate the wire 48. In some embodiments, conductive structures 64 such as UBMs may be formed over and electrically connected to the second RDL 50, and exposed from the molding layer 54. In some embodiments, conductive bumps 66 may be mounted over and electrically connected to the conductive structures 64.

Figure 2E:
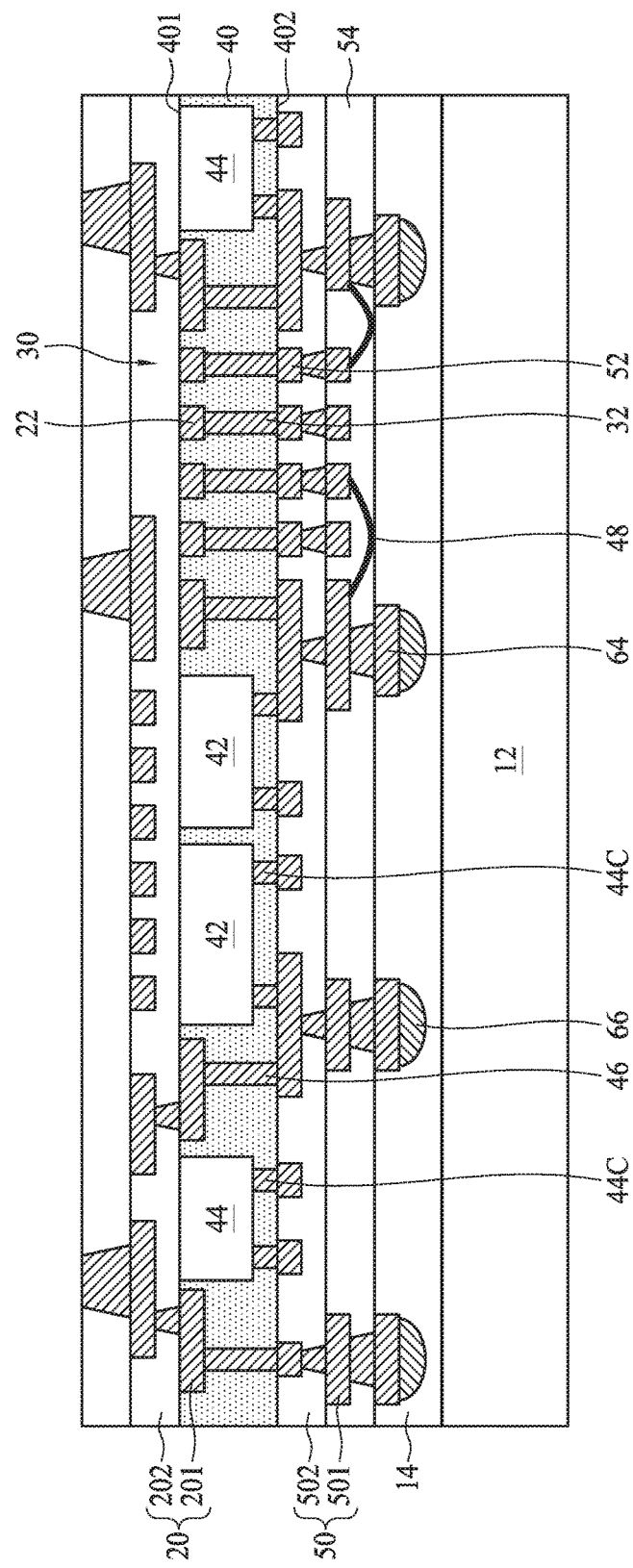
FIG. 2E illustrates one or more stages of an example of a manufacturing method of a semiconductor device package in accordance with some embodiments of the present disclosure.

As depicted in FIG. 2E, the second RDL 50 is attached to another carrier substrate 12, and the first RDL 20 is released from the carrier substrate 10. In some embodiments, the second RDL 50 is attached to the carrier substrate 12 with an adhesive layer 14. In some embodiments, one or more third electronic components 60 are disposed or formed over the first RDL 20, and electrically connected to the first electronic component 42 and/or the second electronic component 44 through the first RDL 20. In some embodiments, the encapsulant 62 is formed over the first RDL 20, encapsulating the one or more third electronic components 60. The carrier substrate 12 is then released from the second RDL 50. The semiconductor device package 1 as illustrated in FIG. 1 is formed.

The semiconductor device package and manufacturing method of the present disclosure are not limited to the above-mentioned embodiments, and may include other different embodiments. To simplify the description and for the convenience of comparison between each of the embodiments of the present disclosure, the same components in each of the following embodiments are marked with the same numerals and are not redundantly described.

Figure 3:
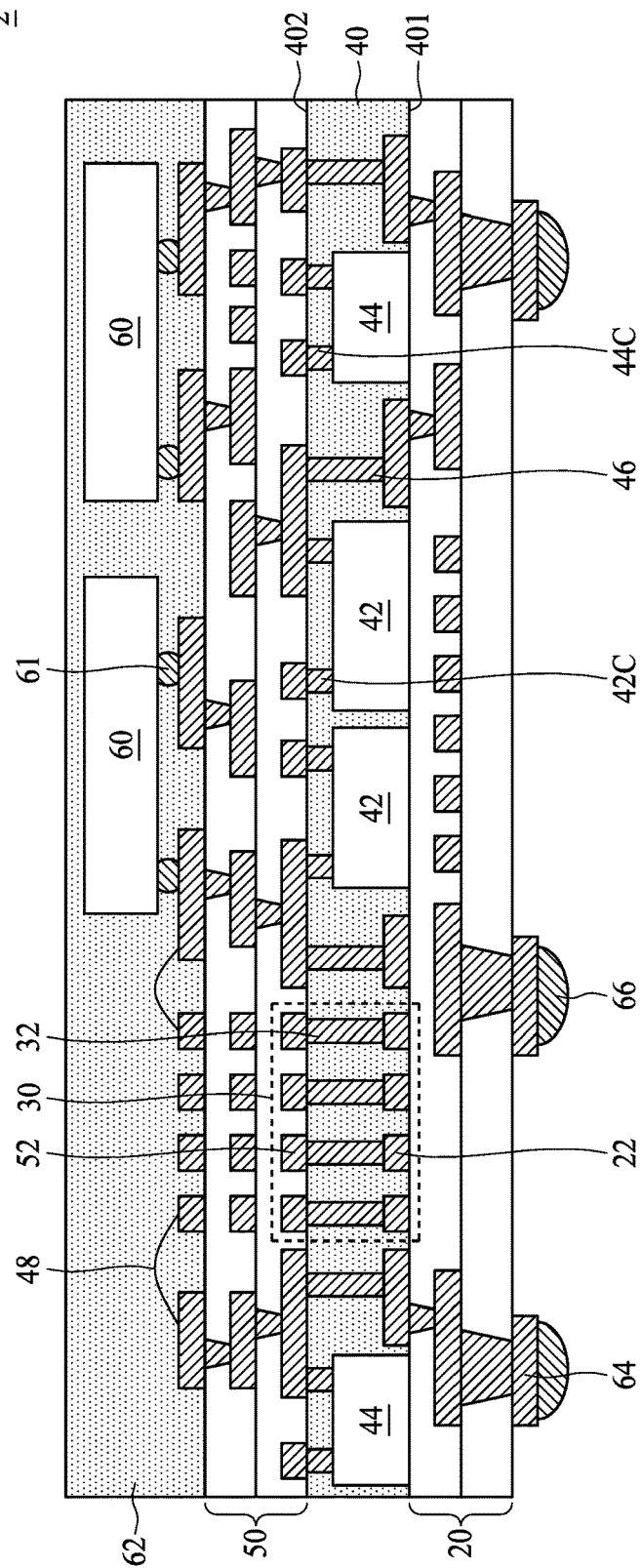
FIG. 3 illustrates a cross-sectional view of a semiconductor device package in accordance with some embodiments of the present disclosure.

In some embodiments, third electronic components 60 may be disposed on either side of a semiconductor device package. In other words, the third electronic components 60 may be disposed adjacent to the first RDL 20 or the second RDL 50. FIG. 3 is a cross-sectional view of a semiconductor device package 2 in accordance with some embodiments of the present disclosure. Different from the semiconductor device package 1 as shown in FIG. 1, the semiconductor device package 2 as shown in FIG. 3 includes the third electronic components 60 of the semiconductor device package 2 that are disposed over the second RDL 50, and opposite to the first electronic component 42 and the second electronic component 44. In some embodiments, at least one third electronic component 60 is electrically connected to the first electronic component 42 and/or the second electronic component 44 through the second RDL 50. In some embodiments, the molding layer 54 may be omitted, and the encapsulant 62 of the semiconductor device package 2 is disposed over the second RDL 50 and encapsulating at least one third electronic component 60 and the wire 48. In some other embodiments, the encapsulant 62 encapsulates a portion of at least one third electronic component 60. In some embodiments, conductive structures 64 of the semiconductor device package 2 may be disposed over and electrically connected to the first RDL 20, and conductive bumps 66 may be mounted over and electrically connected to the conductive structures 64.

Figure 4A:
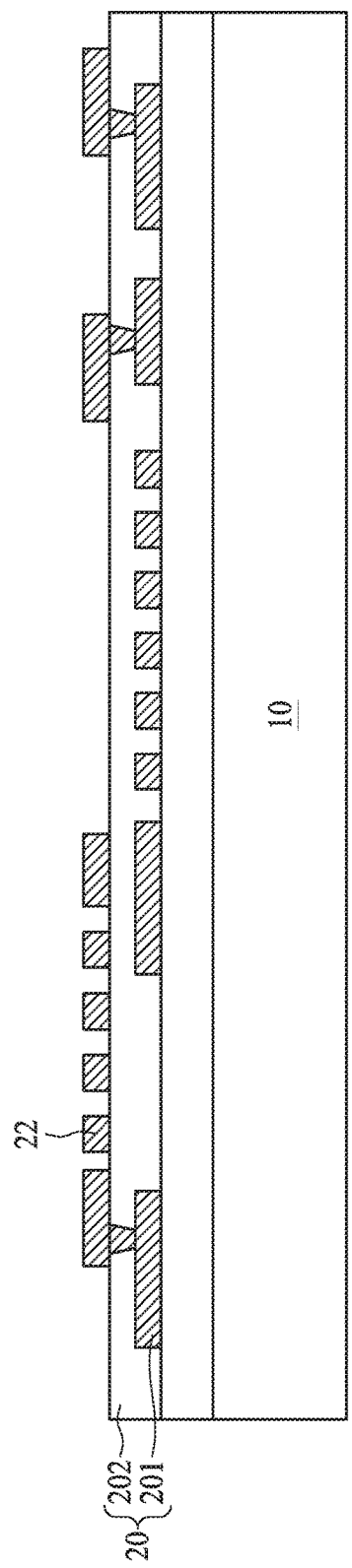
FIG. 4A illustrates one or more stages of an example of a manufacturing method of a semiconductor device package in accordance with some embodiments of the present disclosure.

FIG. 4A, FIG. 4B, FIG. 4C, FIG. 4D and FIG. 4E illustrate various stages of an example of a manufacturing method of the semiconductor device package 2 in accordance with some embodiments of the present disclosure. As depicted in FIG. 4A, the first RDL 20 including the first conductive pieces 22 is formed over a carrier substrate 10.

Figure 4B:
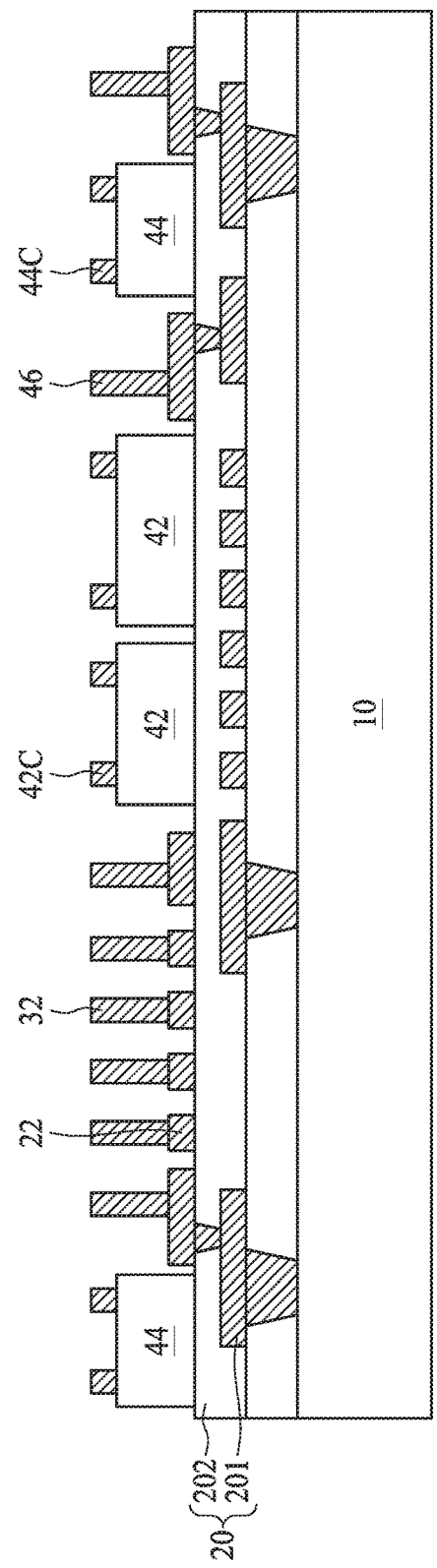
FIG. 4B illustrates one or more stages of an example of a manufacturing method of a semiconductor device package in accordance with some embodiments of the present disclosure.

As depicted in FIG. 4B, the induction pillars 32 are formed over the first RDL 20, and electrically connected to the first conductive pieces 22. In some embodiments, the connection pillars 46 are formed over the first RDL 20, and electrically connected to the first RDL 20. In some embodiments, the induction pillars 32 and the connection pillars 46 are formed simultaneously in the same process. In some other embodiments, the induction pillars 32 are formed before or after the connection pillars 46 being formed. In some embodiments, one or more first electronic components 42 and one or more second electronic components 44 are mounted on and electrically connected to the first RDL 20.

Figure 4C:
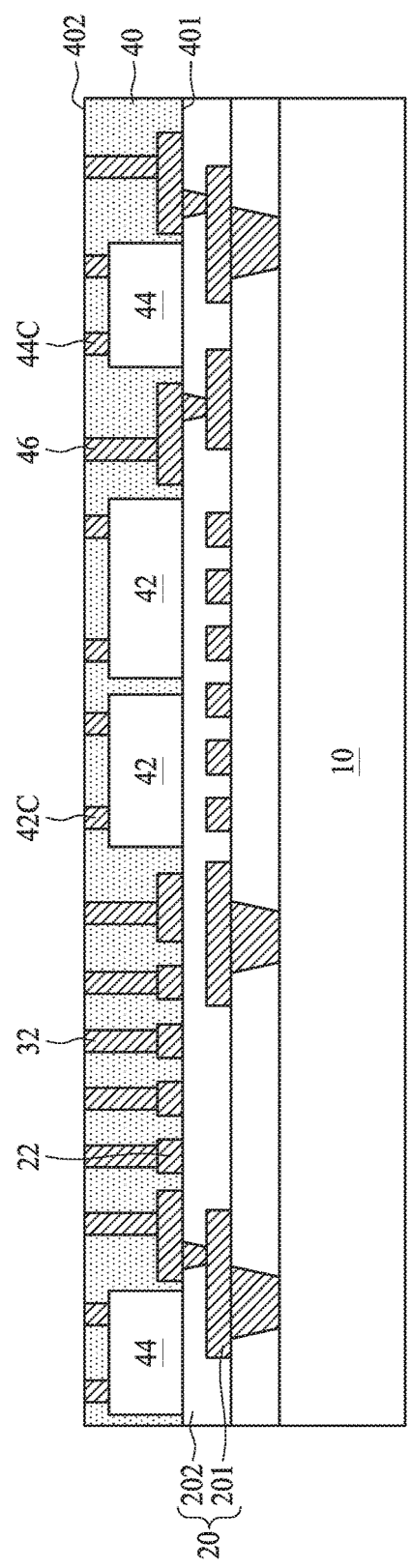
FIG. 4C illustrates one or more stages of an example of a manufacturing method of a semiconductor device package in accordance with some embodiments of the present disclosure.

As depicted in FIG. 4C, the dielectric layer 40 is formed over the first RDL 20. In some embodiments, at least some portion(s) of the first conductive pieces 22, the induction pillars 32, the connection pillars 46, the first electronic components 42 and the second electronic components 44 are encapsulated by the dielectric layer 40. In some embodiments, at least some portion(s) of the induction pillars 32, the connection pillars 46, the first electronic components 44 and the second electronic components 44 are exposed from the second surface 402 of the dielectric layer 40.

Figure 4D:
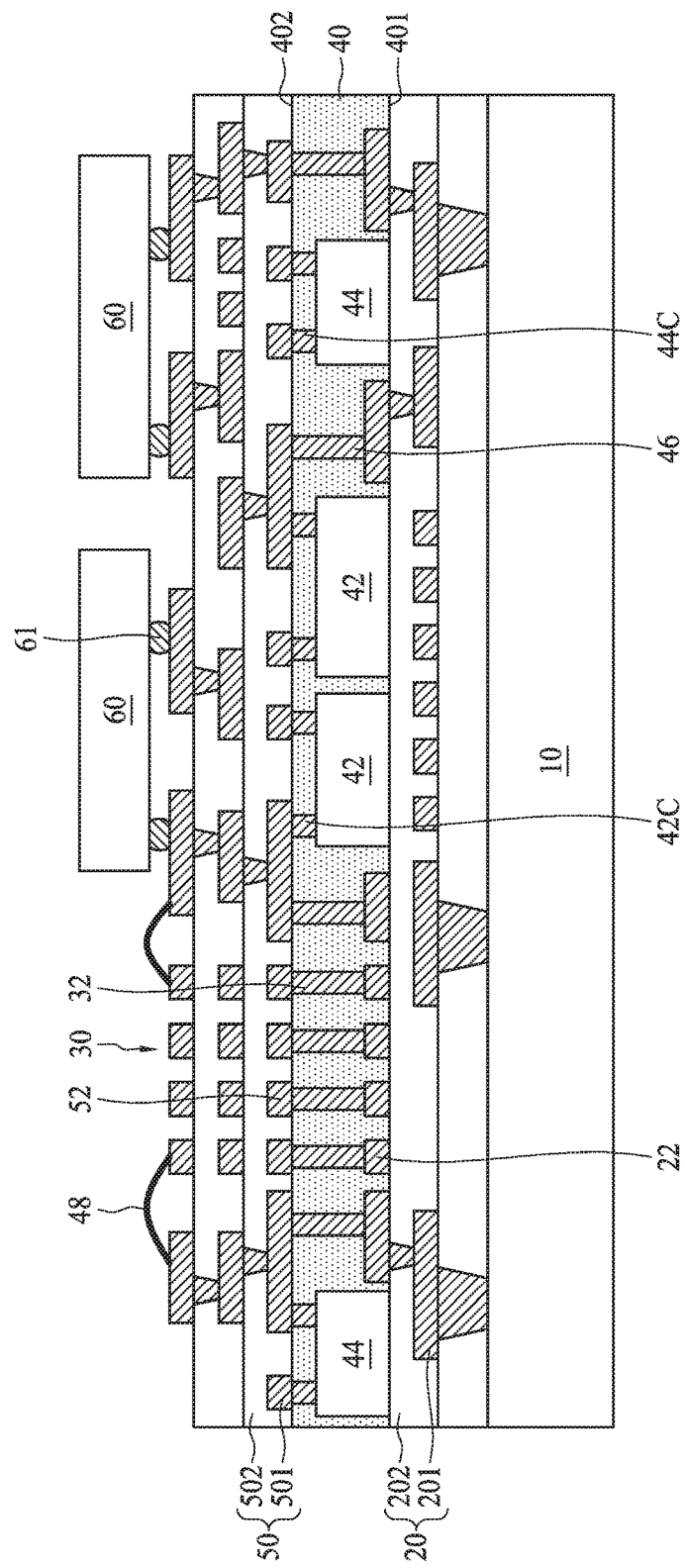
FIG. 4D illustrates one or more stages of an example of a manufacturing method of a semiconductor device package in accordance with some embodiments of the present disclosure.

As depicted in FIG. 4D, the second RDL 50 including the second conductive pieces 52 is formed over the second surface 402 of the dielectric layer 40. The second conductive pieces 52 are electrically connected to at least a portion of the induction pillars 32. The second RDL 50 is electrically connected to the connection pillars 46. The second conductive pieces 52, the induction pillars 32 and the first conductive pieces 22 are electrically connected and collectively form the inductor 30. In some embodiments, at least one wire 48 may be formed to electrically connect one of the second conductive pieces 52 at one end of the wire 48, and to electrically connect another one of the second conductive pieces 52 at another end of the wire 48. In some embodiments, the wire 48 may be formed by wire bonding, but not limited thereto. In some embodiments, one or more third electronic components 60 are disposed or formed over the second RDL 50, and electrically connected to the first electronic component 42 and/or the second electronic component 44 through the second RDL 50.

Figure 4E:
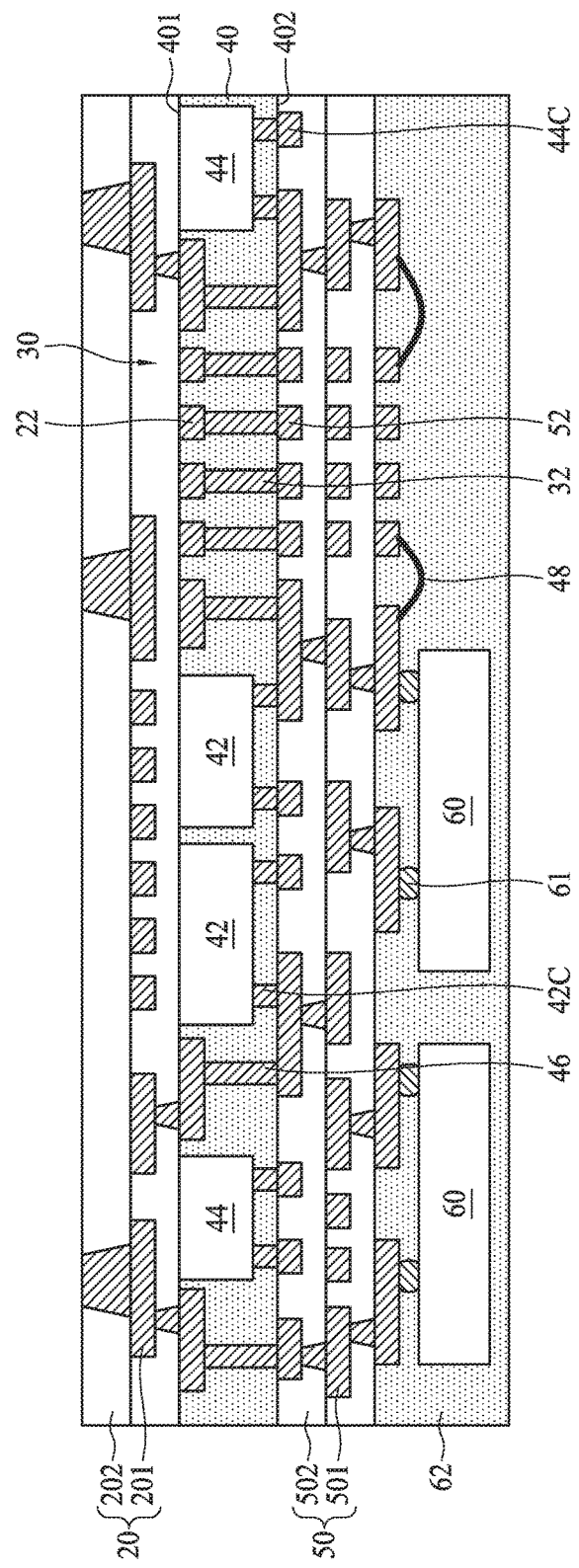
FIG. 4E illustrates one or more stages of an example of a manufacturing method of a semiconductor device package in accordance with some embodiments of the present disclosure.

As depicted in FIG. 4E, the encapsulant 62 is formed over the second RDL 50, encapsulating at least one third electronic component 60 and the wire 48. The first RDL 20 is then released from the carrier substrate 10. In some embodiments, conductive structures 64 such as UBMs may be formed over the first RDL 20, and conductive bumps 66 may be mounted over and electrically connected to the conductive structures 64 to form the semiconductor device package 2.

Figure 5:
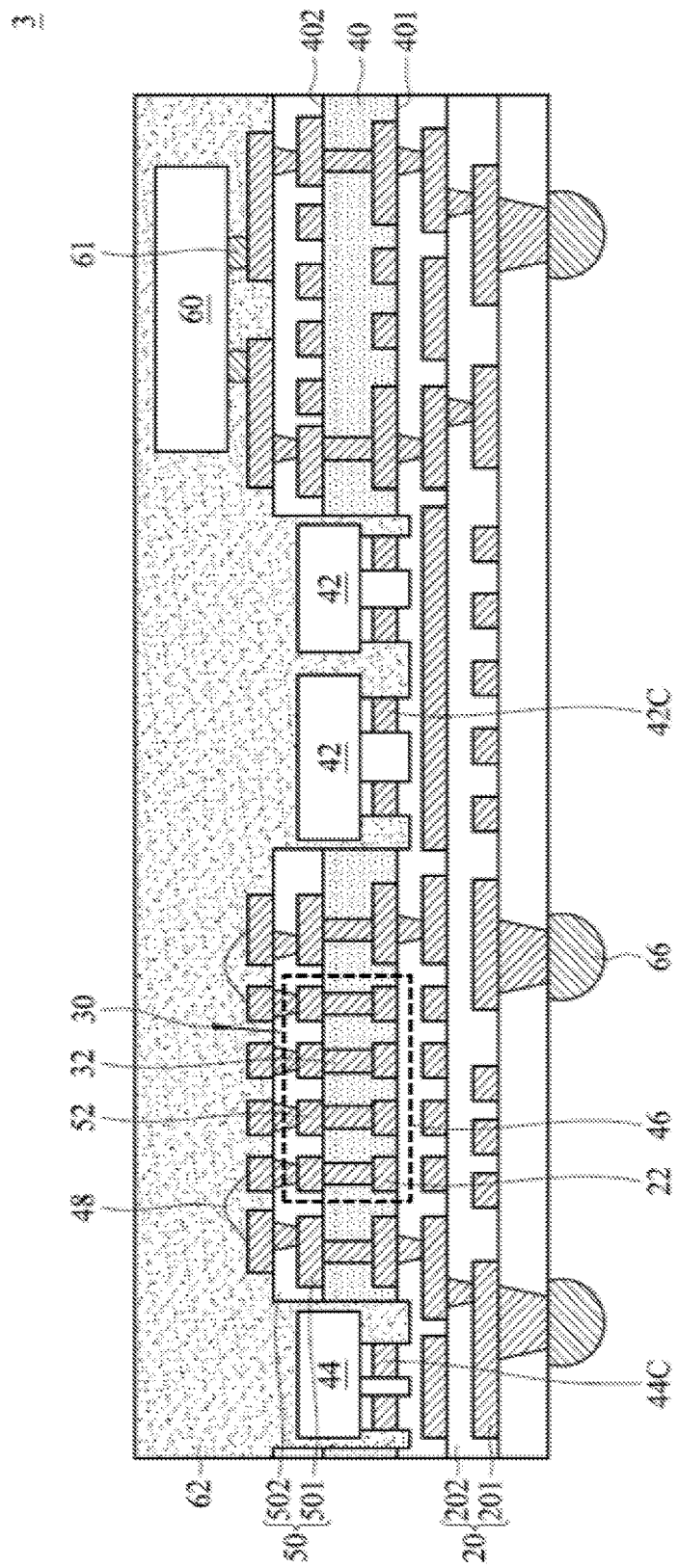
FIG. 5 illustrates a cross-sectional view of a semiconductor device package in accordance with some embodiments of the present disclosure.

In some embodiments, the first electronic component 42 and the second electronic component 44 may be disposed either over the first RDL 20 or over the second RDL 50. FIG. 5 is a cross-sectional view of a semiconductor device package 3 in accordance with some embodiments of the present disclosure. Different from the semiconductor device package 1 as shown in FIG. 1, the semiconductor device package 3 includes the first electronic component 42 and the second electronic component 44 that are disposed over and electrically connected to the first RDL 20 as shown in FIG. 5. In some embodiments, at least one wire 48 is disposed over the second RDL 50, and electrically connected to the second conductive pieces 52 through the second RDL 50. In some embodiments, the third electronic components 60 are disposed or formed over the second RDL 50, and electrically connected to the first electronic component 42 and the second electronic component 44 through the second RDL 50. In some embodiments, the encapsulant 62 is disposed over the second RDL 50, encapsulating at least one third electronic component 60 and the wire 48, as well as the first electronic component 42 and the second electronic component 44. In some embodiments, the conductive bumps 66 may be mounted over and electrically connected to the first RDL 20.

Figure 6A:
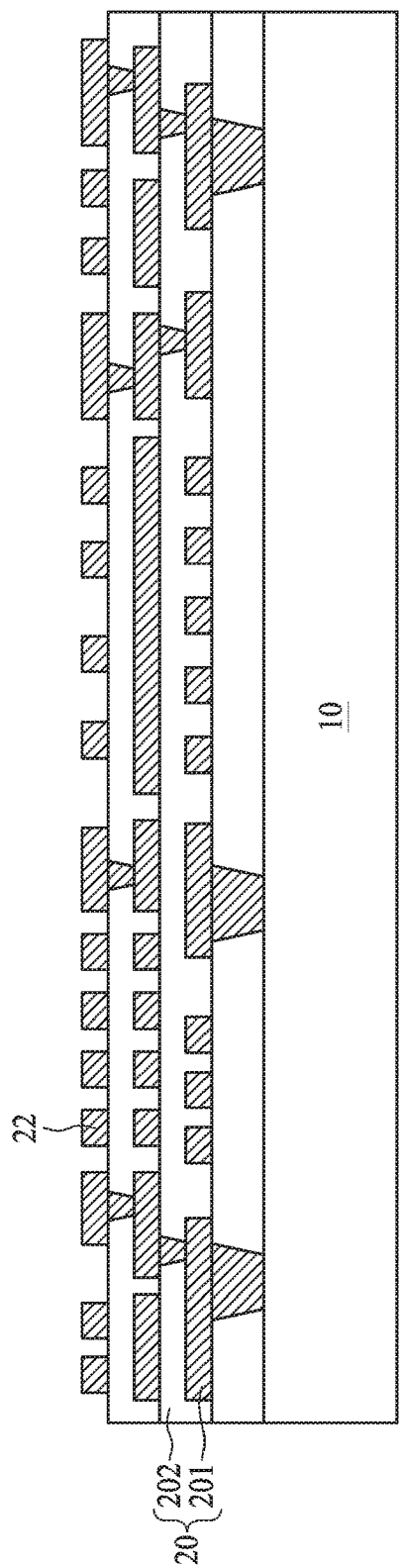
FIG. 6A illustrates one or more stages of an example of a manufacturing method of a semiconductor device package in accordance with some embodiments of the present disclosure.

FIG. 6A, FIG. 6B, FIG. 6C, FIG. 6D and FIG. 6E illustrate various stages of an example of a manufacturing method of the semiconductor device package 3 in accordance with some embodiments of the present disclosure. As depicted in FIG. 6A, the first RDL 20 including the first conductive pieces 22 is formed over a carrier substrate 10.

Figure 6B:
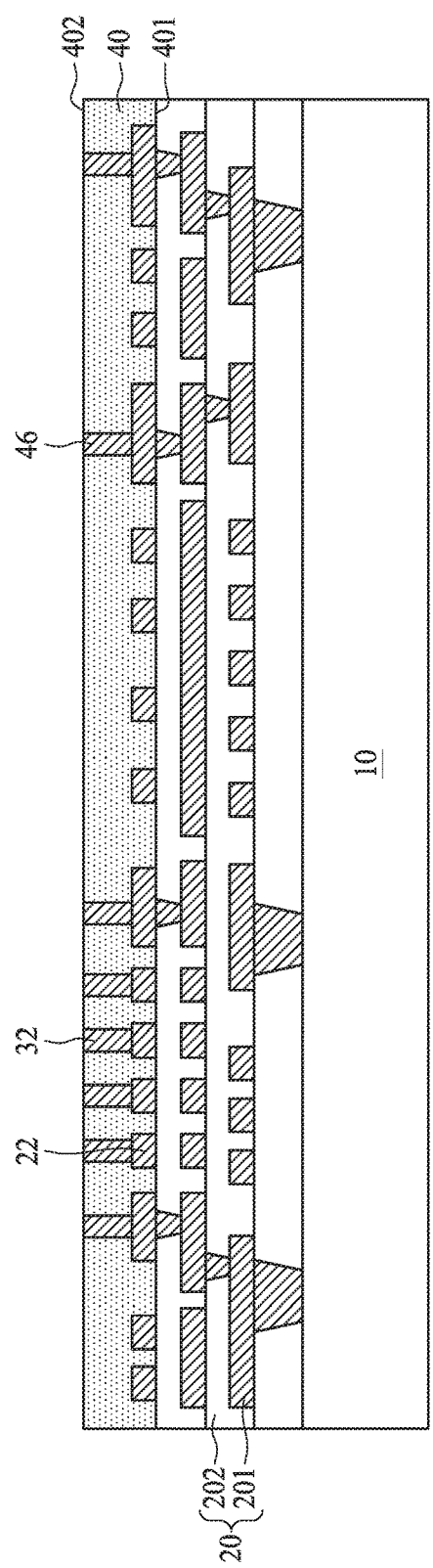
FIG. 6B illustrates one or more stages of an example of a manufacturing method of a semiconductor device package in accordance with some embodiments of the present disclosure.

As depicted in FIG. 6B, the induction pillars 32 are formed over the first RDL 20, and electrically connected to the first conductive pieces 22. In some embodiments, the connection pillars 46 are formed over the first RDL 20, and electrically connected to the first RDL 20. In some embodiments, the induction pillars 32 and the connection pillars 46 are formed simultaneously in the same process. In some other embodiments, the induction pillars 32 are formed before or after the connection pillars 46 being formed. In some embodiments, the dielectric layer 40 is formed over the first RDL 20. In some embodiments, at least some portion(s) of the first conductive pieces 22, the induction pillars 32 and the connection pillars 46 are encapsulated by the dielectric layer 40. In some embodiments, at least some portion(s) of the induction pillars 32 and the connection pillars 46 are exposed from the second surface 402 of the dielectric layer 40.

Figure 6C:
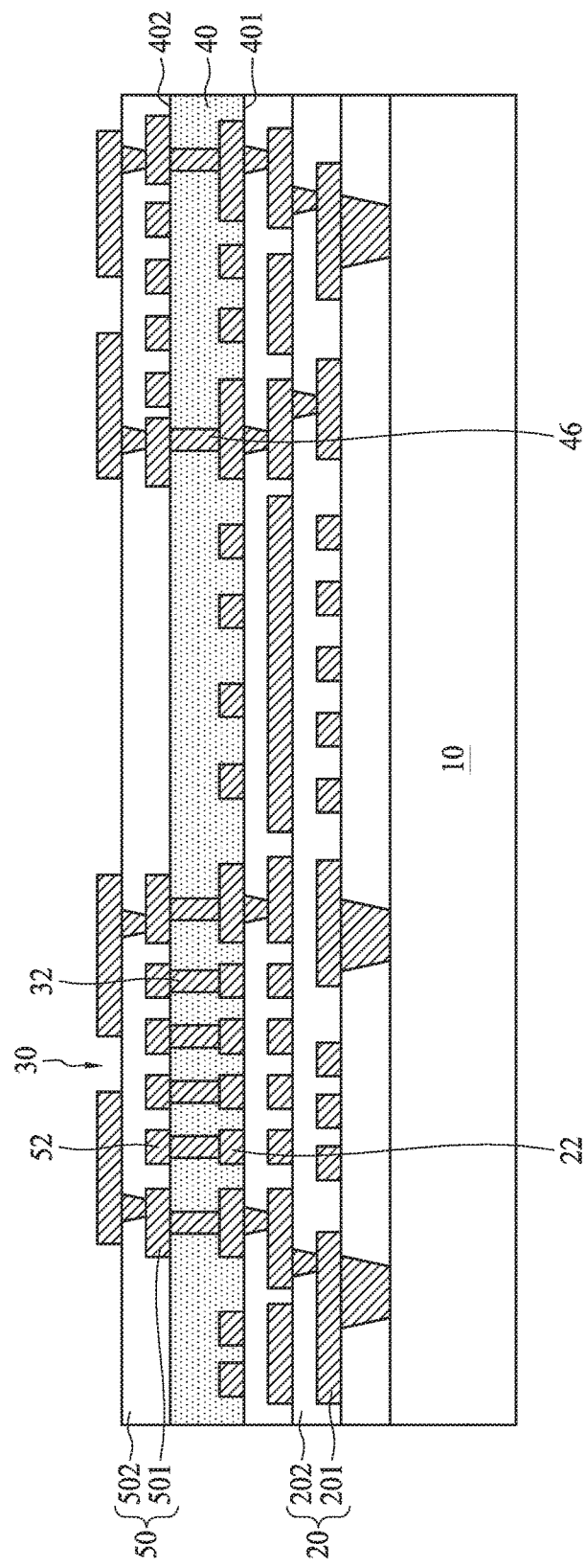
FIG. 6C illustrates one or more stages of an example of a manufacturing method of a semiconductor device package in accordance with some embodiments of the present disclosure.

As depicted in FIG. 6C, the second RDL 50 including the second conductive pieces 52 is formed over the second surface 402 of the dielectric layer 40. The second conductive pieces 52 are electrically connected to at least a portion of the induction pillars 32. The second RDL 50 is electrically connected to the connection pillars 46. The second conductive pieces 52, the induction pillars 32 and the first conductive pieces 22 are electrically connected and collectively form the inductor 30.

Figure 6D:
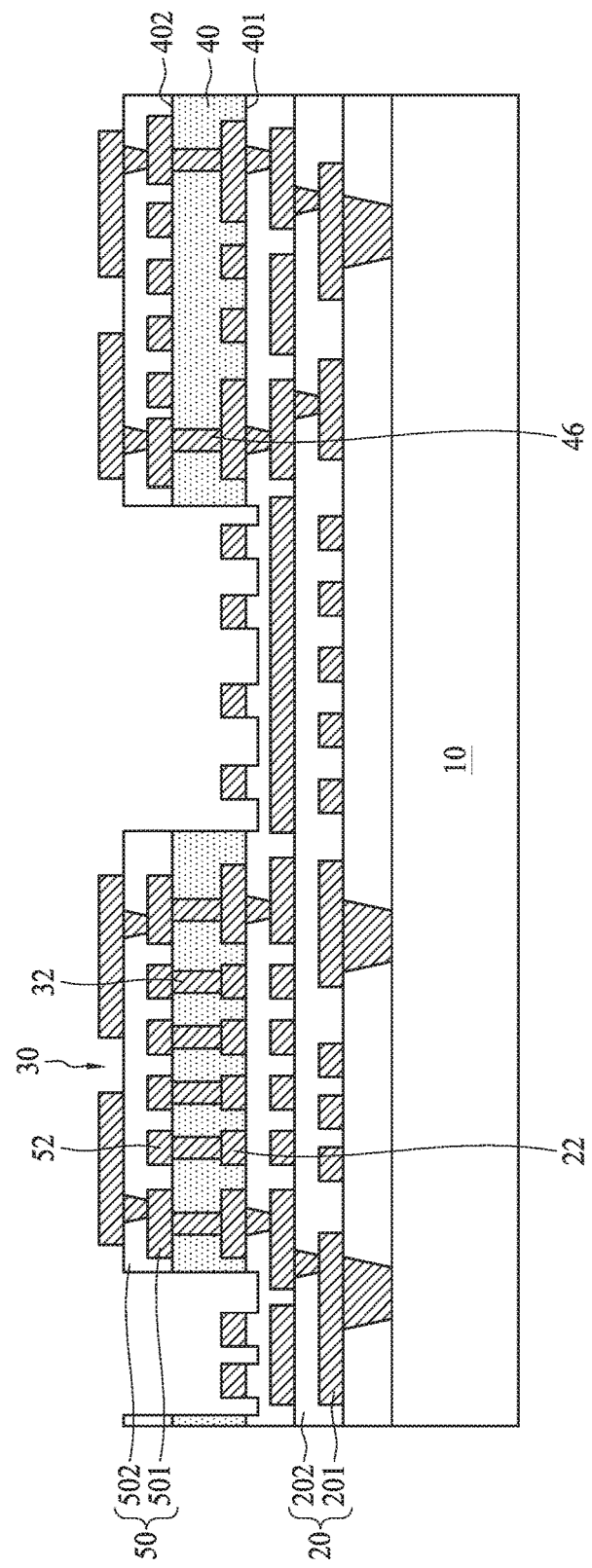
FIG. 6D illustrates one or more stages of an example of a manufacturing method of a semiconductor device package in accordance with some embodiments of the present disclosure.

As depicted in FIG. 6D, a portion of the insulating layer 502 and a portion of the dielectric layer 40 are removed e.g., by sand blasting to expose a portion of the first RDL 20.

Figure 6E:
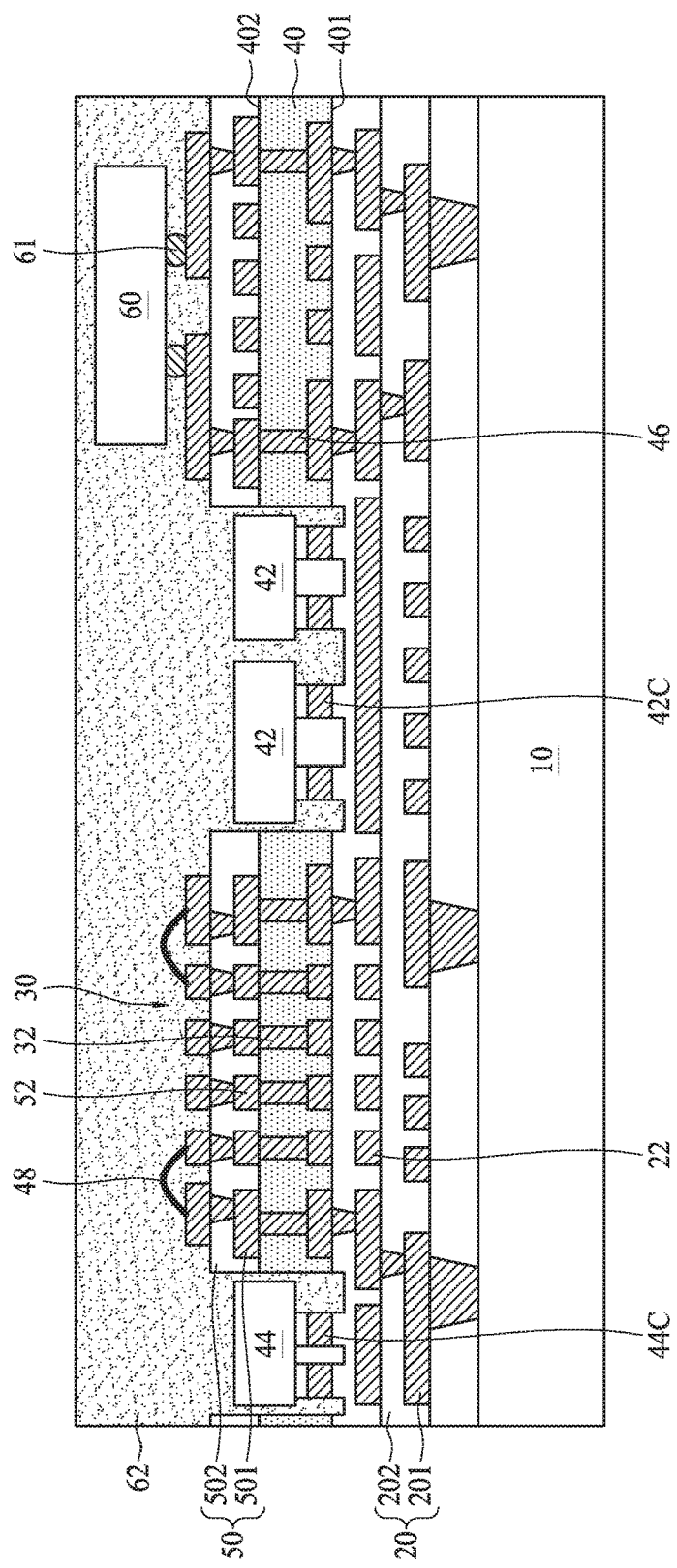
FIG. 6E illustrates one or more stages of an example of a manufacturing method of a semiconductor device package in accordance with some embodiments of the present disclosure.

As depicted in FIG. 6E, one or more first electronic components 42 and one or more second electronic components 44 are disposed on and electrically connected to the first RDL 20, which is exposed from the dielectric layer 40. In some embodiments, one or more third electronic components 60 are disposed over and electrically connected to the second RDL 50. In some embodiments, at least one wire 48 may be formed to electrically connect one of the second conductive pieces 52 at one end of the wire 48, and to electrically connect another one of the second conductive pieces 52 at another end of the wire 48. In some embodiments, the encapsulant 62 is formed over the second RDL 50, encapsulating at least some portion(s) the first electronic components 42, the second electronic components 44, the third electronic component 60 and the wire 48. In some embodiments, the first RDL 20 is then released from the carrier substrate 10. In some embodiments, the conductive bumps 66 may be mounted over and electrically connected to the first RDL 20 to form the semiconductor device package 3.

Figure 7:
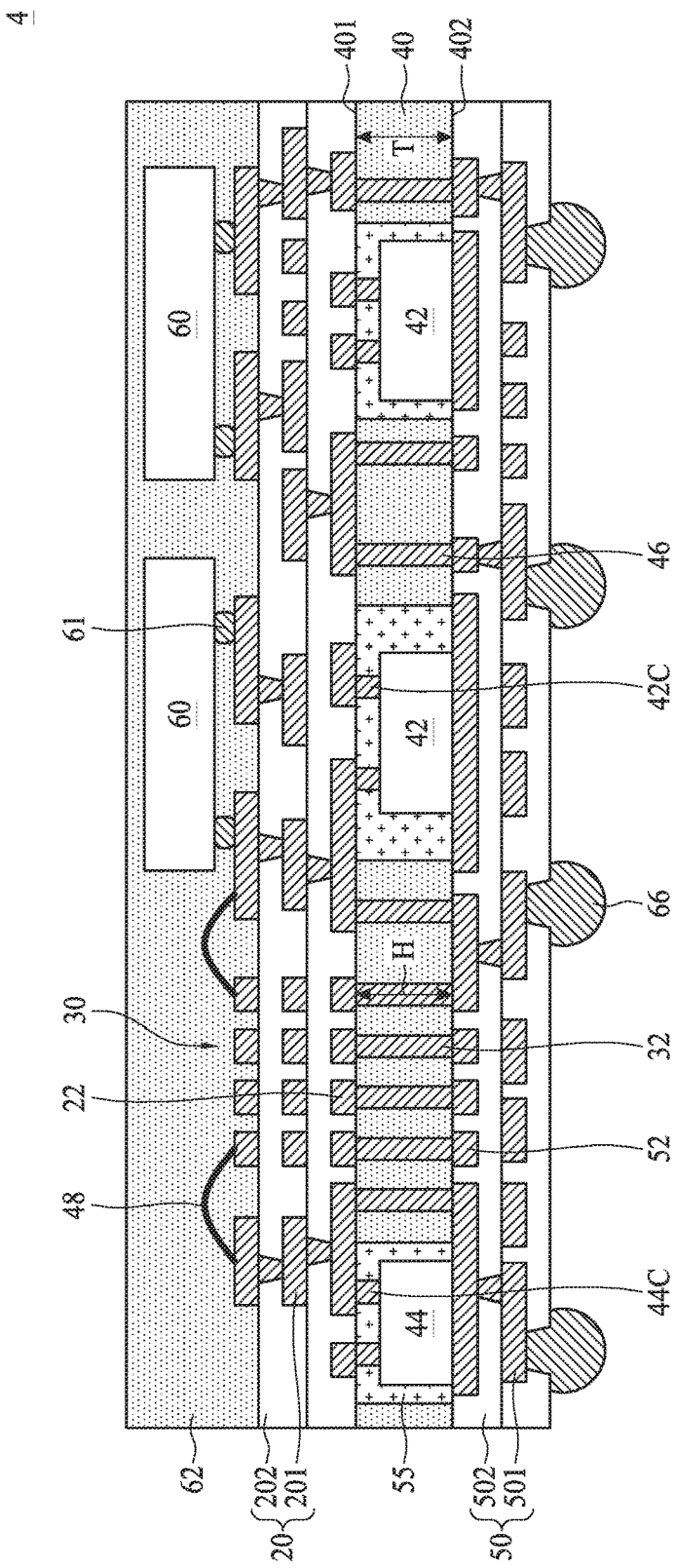
FIG. 7 illustrates a cross-sectional view of a semiconductor device package in accordance with some embodiments of the present disclosure.

In some embodiments, a semiconductor device package may include one or more electronic components disposed between two RDLs and a molding layer encapsulating the one or more electronic components. FIG. 7 is a cross-sectional view of a semiconductor device package 4 in accordance with some embodiments of the present disclosure. As shown in FIG. 7, the semiconductor device package 4 includes a dielectric layer 40, an inductor 30, a first RDL 20, a second RDL 50, one or more first electronic components 42 and one or more second electronic components 44. The dielectric layer 40 includes a first surface 401, and a second surface 402 opposite to the first surface 401. In some embodiments, the dielectric layer 40 may include or may be formed from, but is not limited to, a photo-curable material such as a photoresist or the like.

In some embodiments, the first RDL 20 is disposed adjacent to the first surface 401 of the dielectric layer 40, and the second RDL 50 is disposed adjacent to the second surface 402 of the dielectric layer 40. In some embodiments, the first RDL 20 includes one or more conductive layers 201 and one or more insulating layers 202 stacked to one another. One of the conductive layers 201 may include first conductive pieces 22 exposed from the insulating layer 202 and adjacent to the first surface 401 of the dielectric layer 40. In some embodiments, the first conductive pieces 22 are disposed over the first surface 401 of the dielectric layer 40. In some embodiments, the second RDL 50 includes one or more conductive layers 501 and one or more insulating layers 502 stacked to one another. One of the conductive layers 501 may include second conductive pieces 52 exposed from the insulating layer 502 and adjacent to the second surface 402 of the dielectric layer 40. In some embodiments, the second conductive pieces 52 are disposed over the second surface 402 of the dielectric layer 40.

The inductor 30 is disposed in the dielectric layer 40. In some embodiments, the inductor 30 includes induction pillars 32. Each of the induction pillars 32 penetrates through the dielectric layer 40, and each of the induction pillars 32 is interconnected between a respective one of the first conductive pieces 22 of the first RDL 20 and a respective one of the second conductive pieces 52 of the second RDL 50. In some embodiments, the height H of the induction pillars 32 is substantially equal to the thickness T of the dielectric layer 40. In some embodiments, at least some of the induction pillars 32 are electrically connected through the first conductive pieces 22 and the second conductive pieces 52. In some embodiments, the inductor 30 includes at least one core area substantially perpendicular to the first surface 401 or the second surface 402 of the dielectric layer 40, where the core area includes one or more of the induction pillars 32.

In some embodiments, the first electronic component 42 and the second electronic component 44 are between the first RDL 20 and the second RDL 50. In some embodiments, the semiconductor device package 4 further includes a molding layer 55 surrounded by the dielectric layer 40, and the molding layer 55 encapsulates the first electronic component 42 and the second electronic component 44. In some embodiments, the first electronic component 42 and the second electronic component 44 may be electrically connected to each other through the inductor 30. In some embodiments, the first electronic component 42 and the second electronic component 44 may be electrically connected to the first RDL 20 through conductive structures 42C and conductive structures 44C, respectively. The conductive structures 42C and the conductive structures 44C may include conductive pillars, conductive posts, bonding pads or the like.

In some embodiments, the semiconductor device package 4 further includes connection pillars 46 penetrating through the dielectric layer 40, and electrically connected to the first RDL 20 and the second RDL 50. In some embodiments, the first electronic component 42 and the second electronic component 44 are further electrically connected to the second RDL 50 through the inductor 30 and the connection pillars 46. In some embodiments, the conductive structures 42C and the conductive structures 44C are shorter than the induction pillars 32 and the connection pillars 46. In some embodiments, at least one end of each of the conductive structures 42C, the conductive structures 44C, the induction pillars 32 and the connection pillars 46 may be substantially at the same level as and electrically connected to the first RDL 20.

In some embodiments, the semiconductor device package 4 further includes one or more third electronic components 60 disposed over the first RDL 20, and opposite to the first electronic component 42 and the second electronic component 44. In some embodiments, at least one third electronic component 60 is electrically connected to the first electronic component 42 and the second electronic component 44 through the first RDL 20. In some embodiments, the semiconductor device package 4 may further include at least one wire 48 disposed over the first RDL 20. The wire 48 may be electrically connected to one of the first conductive pieces 22 at one end of the wire 48, and electrically connected to another one of the first conductive pieces 22 at another end of the wire 48. In some embodiments, the wire 48 may be formed by wire bonding. The wire 48 may be formed subsequent to formation of the inductor 30, and thus may be configured to adjust the impedance of the inductor 30 if an actual impedance of the inductor 30 is deviated from a pre-designed impedance.

In some embodiments, the semiconductor device package 4 may further include an encapsulant 62 disposed over the first RDL 20 and encapsulating at least one third electronic component 60 and the wire 48. In some embodiments, the semiconductor device package 4 may further include conductive bumps 66 such as solder bumps, solder balls, solder pastes or the like, mounted over and electrically connected to the second RDL 50, and configured to electrically connect to another electronic device such as a circuit board or the like.

Figure 8A:
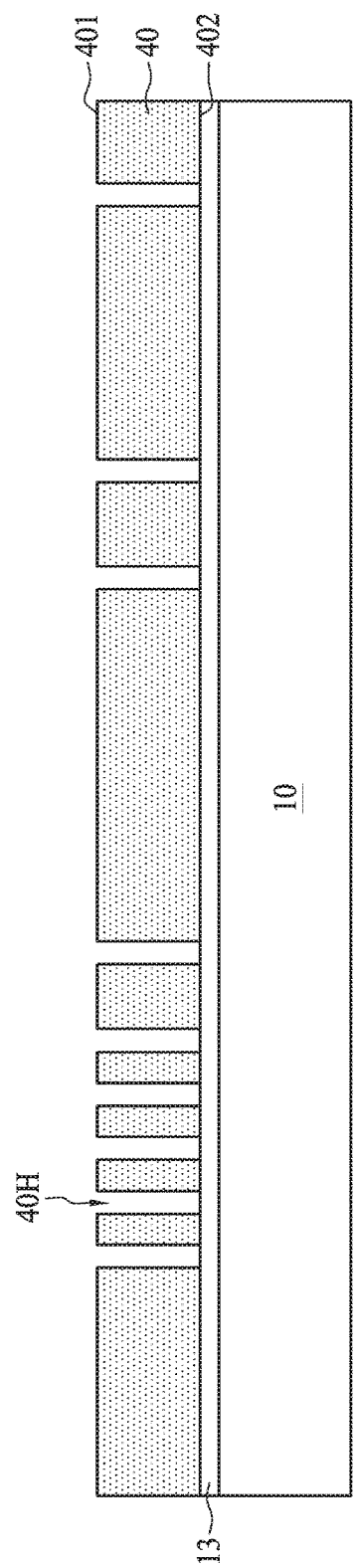
FIG. 8A illustrates one or more stages of an example of a manufacturing method of a semiconductor device package in accordance with some embodiments of the present disclosure.

FIG. 8A, FIG. 8B, FIG. 8C, FIG. 8D and FIG. 8E illustrate various stages of an example of a manufacturing method of the semiconductor device package 4 in accordance with some embodiments of the present disclosure. As depicted in FIG. 8A, a seed layer 13 is formed over a carrier substrate 10. In some embodiments, the seed layer 13 may include a titanium copper seed layer, but not limited thereto. A dielectric layer 40 is formed over the seed layer 13. In some embodiments, the dielectric layer 40 may include or may be formed from, but is not limited to, a photo-curable material such as a photoresist or the like. In some embodiments, the dielectric layer 40 includes one or more openings 40H at least partially exposing the seed layer 13.

Figure 8B:
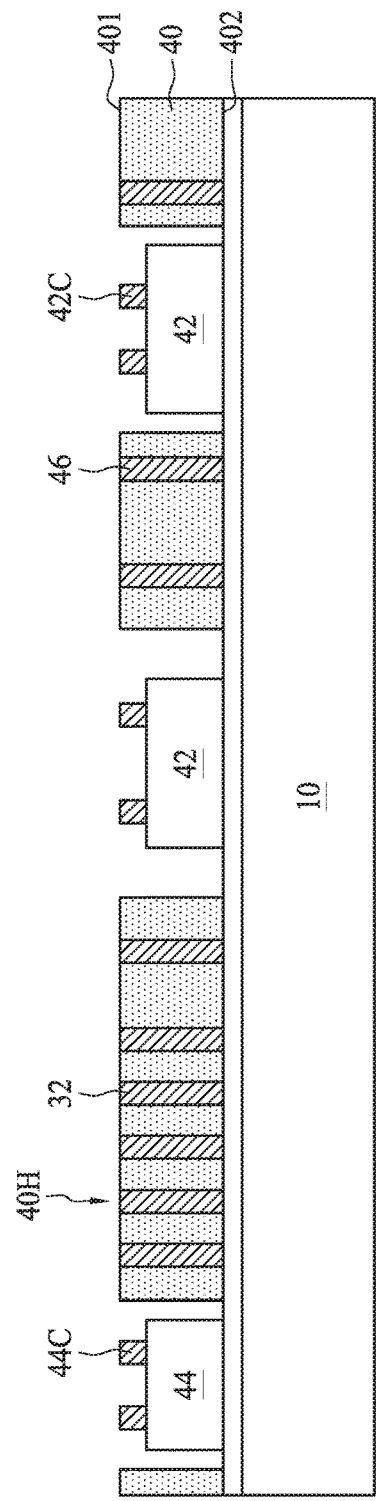
FIG. 8B illustrates one or more stages of an example of a manufacturing method of a semiconductor device package in accordance with some embodiments of the present disclosure.

As depicted in FIG. 8B, the induction pillars 32 are formed over the seed layer 13 through at least some of the openings 40H by, e.g., electroplating. In some embodiments, the connection pillars 46 are formed over the seed layer 13 through at least some of the openings 40H. In some embodiments, the induction pillars 32 and the connection pillars 46 are formed simultaneously in the same process. In some other embodiments, the induction pillars 32 are formed before or after the connection pillars 46 being formed. In some embodiments, a portion of the dielectric layer 40 is removed by, e.g., sand blasting to expose a portion of the seed layer 13. In some embodiments, one or more first electronic components 42 and one or more second electronic components 44 are mounted over the seed layer 13, such by forming openings in the dielectric layer 40 and mounting the first electronic components 42 and the second electronic components 44 in the openings.

Figure 8C:
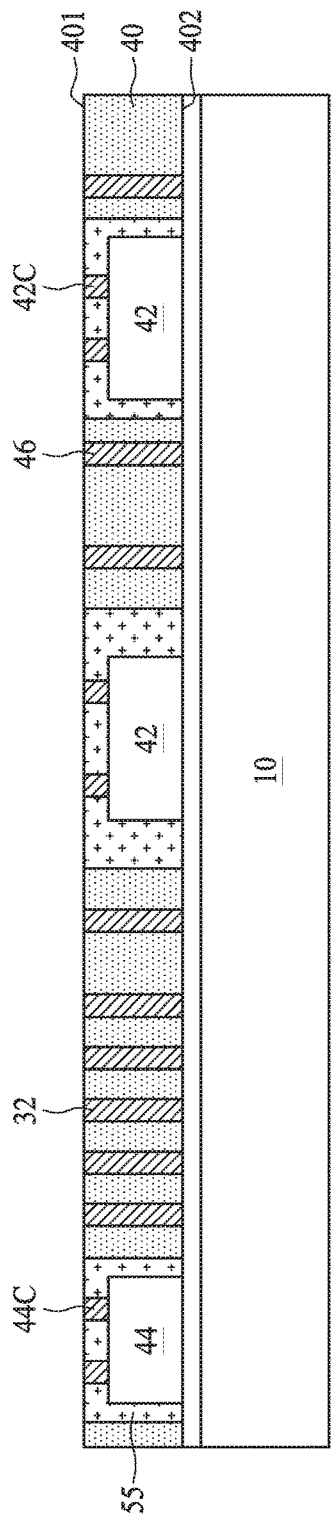
FIG. 8C illustrates one or more stages of an example of a manufacturing method of a semiconductor device package in accordance with some embodiments of the present disclosure.
Figure 8D:
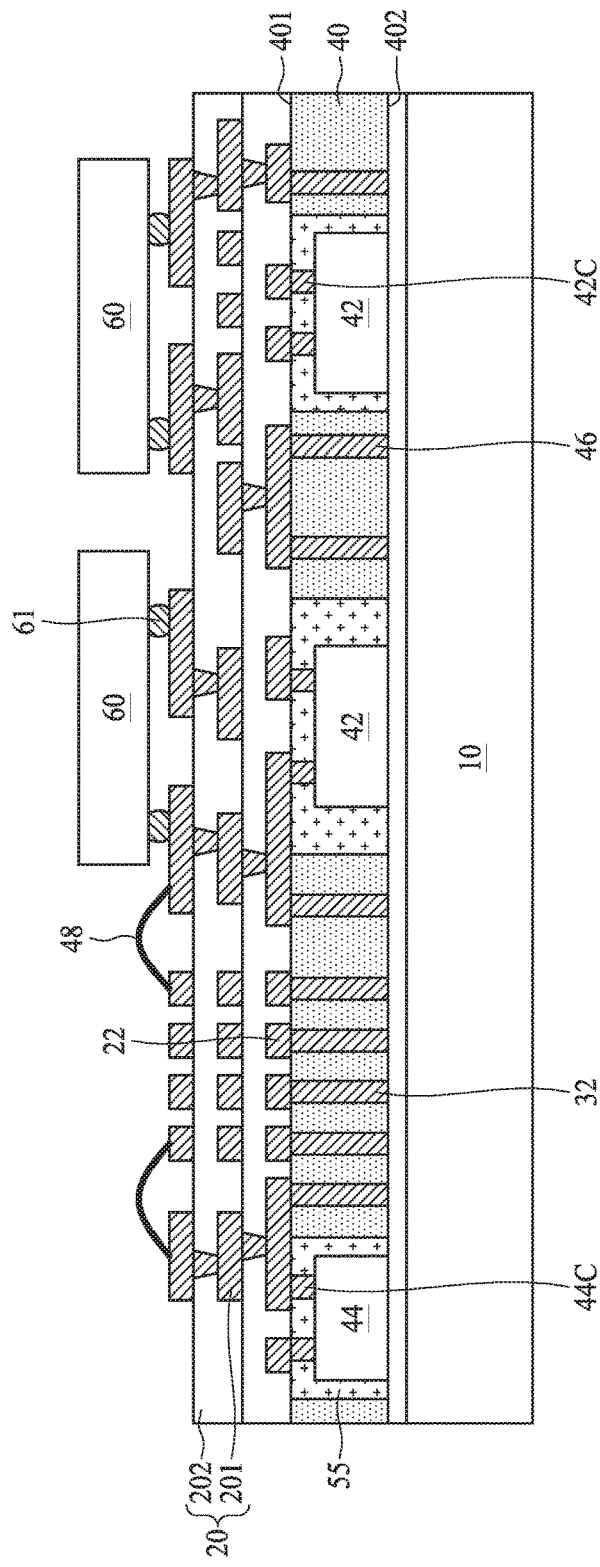
FIG. 8D illustrates one or more stages of an example of a manufacturing method of a semiconductor device package in accordance with some embodiments of the present disclosure.

As depicted in FIG. 8C, a molding layer 55 is formed over the exposed seed layer 13 and encapsulates the first electronic components 42 and the second electronic components 44. In some embodiments, the molding layer 55 is thinned by, e.g., grinding to expose at least some portion(s) of the induction pillars 32, the connection pillars 46, the conductive structures 42C and the conductive structures 44C. As depicted in FIG. 8D, the first RDL 20 including the first conductive pieces 22 is formed over the first surface 401 of the dielectric layer 40, and is electrically connected to the induction pillars 32, the connection pillars 46, the conductive structures 42C and the conductive structures 44C. In some embodiments, one or more third electronic components 60 are disposed over and electrically connected to the first RDL 20. In some embodiments, at least one wire 48 may be formed to electrically connect a portion of the first conductive pieces 22 through the first RDL 20.

Figure 8E:
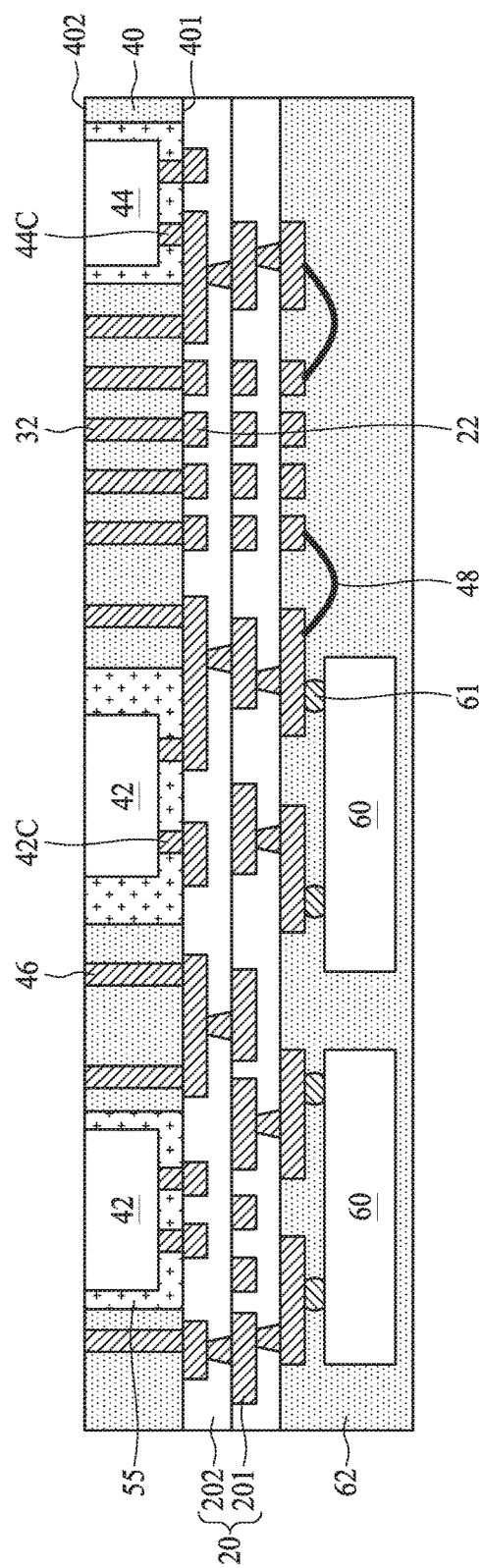
FIG. 8E illustrates one or more stages of an example of a manufacturing method of a semiconductor device package in accordance with some embodiments of the present disclosure.

As depicted in FIG. 8E, the encapsulant 62 is formed over the first RDL 20, and encapsulates at least one third electronic component 60 and the wire 48. In some embodiments, the dielectric layer 40 is then released from the carrier substrate 10 and the seed layer 13. In some embodiments, the second RDL 50 including the second conductive pieces 52 is formed over the second surface 402 of the dielectric layer 40, and is electrically connected to the induction pillars 32 and the connection pillars 46. The second conductive pieces 52, the induction pillars 32 and the first conductive pieces 22 are electrically connected and collectively form the inductor 30. In some embodiments, the conductive bumps 66 may be mounted over and electrically connected to the second RDL 50 to form the semiconductor device package 4.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
  a dielectric layer comprising a first surface, and a second surface opposite to the first surface;
  a first redistribution layer (RDL) adjacent to the first surface of the dielectric layer;
  a second RDL adjacent to the second surface of the dielectric layer, wherein at least one of the first RDL and the second RDL comprises an insulating layer, and a hardness of the insulating layer is greater than a hardness of the dielectric layer;
  an inductor disposed in the dielectric layer, the inductor comprising a plurality of induction pillars through the dielectric layer, a plurality of first conductive pieces adjacent to the first surface of the dielectric layer, and a plurality of second conductive pieces adjacent to the second surface of the dielectric layer, wherein each of the induction pillars extends through the dielectric layer, and each of the induction pillars is interconnected between a respective one of the first conductive pieces and a respective one of the second conductive pieces; and
  a first electronic component and a second electronic component disposed in the dielectric layer and between the first RDL and the second RDL, and electrically connected to each other through the inductor.

2. The semiconductor device package of claim 1, wherein the first electronic component comprises an active component, and the second electronic component comprises a passive component.

3. The semiconductor device package of claim 1, wherein the dielectric layer comprises a polymeric dielectric layer, and a material of the polymeric dielectric layer comprises a photo-curable material.

4. The semiconductor device package of claim 1, further comprising a plurality of connection pillars extending through the dielectric layer, and electrically connected to the first RDL and the second RDL.

5. The semiconductor device package of claim 1, further comprising a third electronic component over the first RDL, wherein the first RDL is disposed between the third electronic component and the first electronic component, and between the third electronic component and the second electronic component.

6. The semiconductor device package of claim 1, further comprising a wire over the second RDL, wherein the wire is electrically connected to one of the second conductive pieces at one end of the wire, and electrically connected to another one of the second conductive pieces at another end of the wire.

7. A semiconductor device package, comprising:
a dielectric layer comprising a first surface, and a second surface opposite to the first surface;
an inductor disposed in the dielectric layer, the inductor comprising:
  a plurality of induction pillars extending through the dielectric layer;
  a plurality of first conductive pieces adjacent to the first surface of the dielectric layer, and electrically connected to the induction pillars; and
  a plurality of second conductive pieces adjacent to the second surface of the dielectric layer, and electrically connected to the induction pillars, wherein a sum of a height of a first induction pillar of the plurality of induction pillars and a height of a first conductive piece of the plurality of first conductive pieces stacked on the first induction pillar is substantially equal to a thickness of the dielectric layer;
and
a wire electrically connected to at least one of the induction pillars.

8. The semiconductor device package of claim 7, further comprising a molding layer encapsulating the wire.

9. The semiconductor device package of claim 1, wherein at least a portion of the plurality of first conductive pieces is surrounded by the dielectric layer.

10. The semiconductor device package of claim 7, further comprising a first redistribution layer (RDL) adjacent to the first surface of the dielectric layer.

11. The semiconductor device package of claim 10, wherein the first RDL comprises a first insulating layer and a first conductive layer disposed on the first insulating layer.

12. The semiconductor device package of claim 10, further comprising a second RDL adjacent to the second surface of the dielectric layer.

13. The semiconductor device package of claim 12, wherein the second RDL comprises a second insulating layer and a second conductive layer disposed on the first insulating layer.

14. The semiconductor device package of claim 12, further comprising a plurality of connection pillars extending through the dielectric layer, and electrically connected to the first RDL and the second RDL.

15. The semiconductor device package of claim 7, further comprising a plurality of electronic components disposed in the dielectric layer, and electrically connected to each other through the inductor.

16. The semiconductor device package of claim 7, wherein edges of the first conductive pieces are surrounded by the dielectric layer.

17. The semiconductor device package of claim 7, wherein edges of the second conductive pieces are exposed from the dielectric layer.

18. The semiconductor device package of claim 7, wherein the dielectric layer comprises a polymeric dielectric layer.

* * * * *